United States Patent [19]

Prestel

[11] Patent Number: 5,200,657
[45] Date of Patent: Apr. 6, 1993

[54] APPARATUS FOR CONTROLLING OR REGULATING EQUIPMENT POWERED BY BATTERIES

[75] Inventor: Fritz Prestel, Hausen A. Tann, Fed. Rep. of Germany

[73] Assignee: BSG-Schalttechnik GmbH & Co. KG, Ballingen, Fed. Rep. of Germany

[21] Appl. No.: 797,441

[22] Filed: Nov. 22, 1991

[30] Foreign Application Priority Data

Dec. 5, 1990 [DE] Fed. Rep. of Germany ....... 4038786

[51] Int. Cl.⁵ ............................................. H02K 7/14
[52] U.S. Cl. ........................................ 310/50; 310/64
[58] Field of Search ................... 310/47, 50, 67 R, 64; 200/1 V, 5 R, 43.17; 361/383, 386, 387, 388; 363/141

[56] References Cited

U.S. PATENT DOCUMENTS

| | | | |
|---|---|---|---|
| 3,585,476 | 6/1971 | Rutchik | 318/331 |
| 3,611,095 | 10/1971 | Schnizler | 310/50 X |
| 3,721,879 | 3/1973 | Corey et al. | 310/50 X |
| 4,097,705 | 6/1978 | Harvell | 310/50 X |
| 4,118,615 | 10/1978 | Leibundgut | 200/157 |
| 4,241,297 | 12/1980 | Piber et al. | 310/50 X |
| 4,292,571 | 9/1981 | Cuneo | 310/50 X |
| 4,348,603 | 9/1982 | Huber | 310/50 |
| 4,412,158 | 10/1983 | Jefferson et al. | 318/257 |
| 4,454,459 | 6/1984 | Huber | 318/484 X |
| 4,556,803 | 12/1985 | Weigert | 310/50 X |
| 4,719,395 | 1/1988 | Aoi et al. | 318/349 |
| 4,737,661 | 4/1988 | Lessig, III et al. | 307/140 |
| 4,739,209 | 4/1988 | Sherman | 310/249 |
| 4,755,706 | 7/1988 | Harnder, Jr. et al. | 310/332 |
| 4,777,393 | 10/1988 | Peot | 310/50 |
| 4,903,318 | 2/1990 | Nagata | 318/295 X |
| 4,937,705 | 6/1990 | Piber | 361/388 |
| 5,014,793 | 5/1991 | Germanton et al. | |

FOREIGN PATENT DOCUMENTS

| | | | |
|---|---|---|---|
| 0165941 | 9/1984 | Japan | 310/64 |
| 0234030 | 9/1989 | Japan | 310/64 |

Primary Examiner—Steven L. Stephan
Assistant Examiner—Judson H. Jones
Attorney, Agent, or Firm—Darby & Darby

[57] ABSTRACT

An apparatus to control the operation of equipment powered by batteries, particularly for supplying the current to electrical equipment, such as cordless screwdrivers and cordless drills. The apparatus includes a housing, an external, displaceable trigger handle on the housing and an electric circuit with at least one power semiconductor. The function of the electric circuit being controlled preferably is a result of potentiometer adjustment through displacement of the trigger handle. The power semiconductor, which control the flow of current to the equipment motor, is disposed within the housing on a circuit board, which in turn makes contact with a heat sink, which protrudes through an opening in the housing freely to the outside.

22 Claims, 7 Drawing Sheets

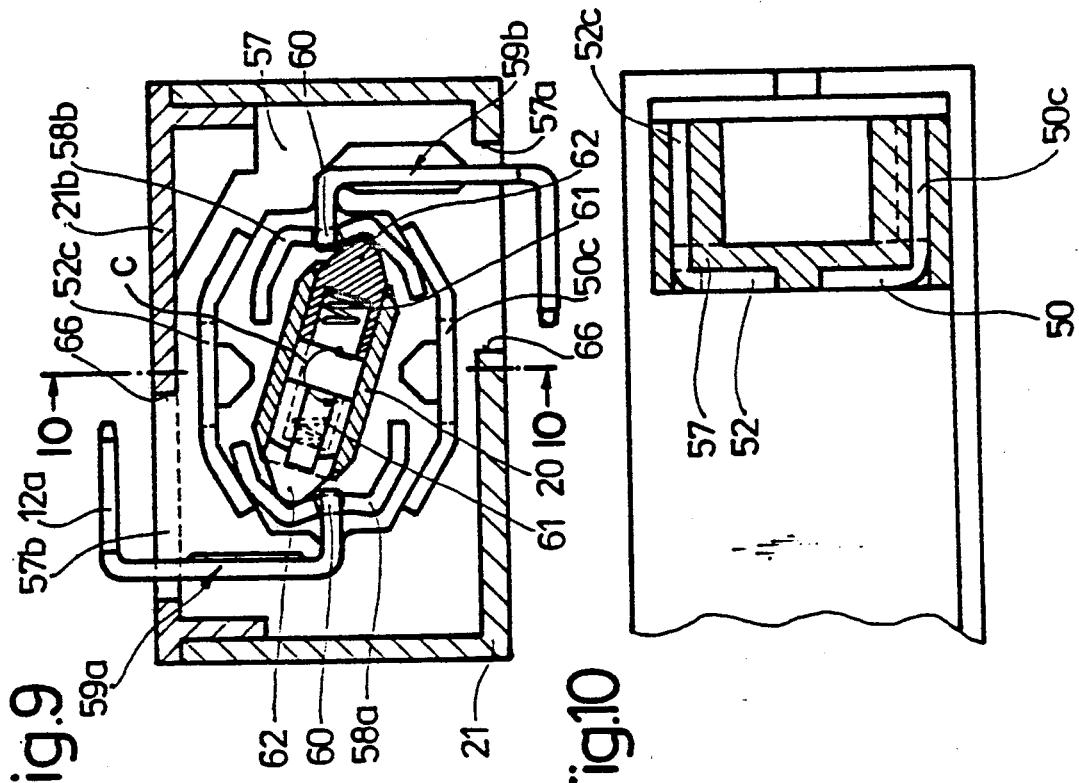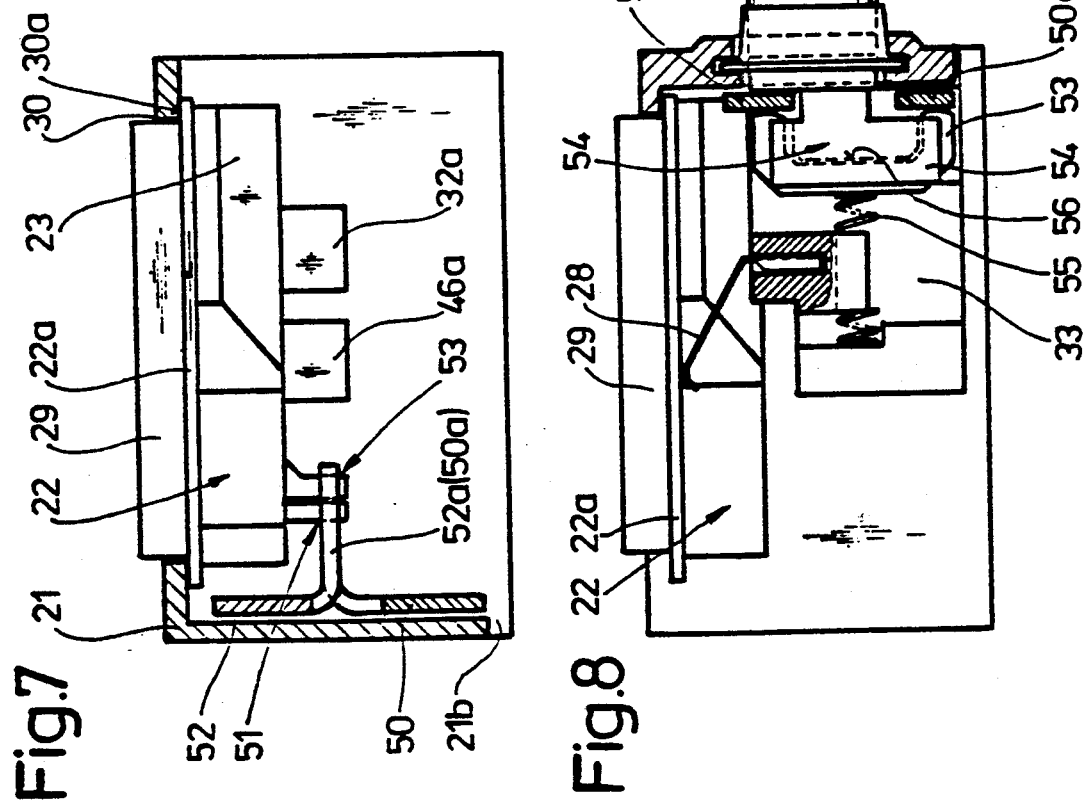

APPARATUS FOR CONTROLLING OR REGULATING EQUIPMENT POWERED BY BATTERIES

BACKGROUND OF THE INVENTION

1. Field of the Invention

The invention relates generally to an electrically operated control device and, more specifically, to a compact control device for reversible equipment and the like.

2. Discussion of Related Art

An apparatus or electronic switches, which control electrical equipment that is powered by batteries and which connect electric motors to sources supplying them with current, are known in different embodiments. In particular, such an apparatus or electronic switches are used with manually operated electrical equipment such as drills, cordless screwdrivers, etc. In effecting such control, the current, which is supplied by a source to the driving motor of the manually operated electrical equipment, flows through a power semiconductor. The conductivity of the power semiconductor is controlled by the position of a trigger handle in such a manner that it is possible to control the power to the electric motor.

Appropriate switches, such as those manufactured and sold, for example, by the CAPAX Company, etc., are usually constructed so that at least the power transistor must be mounted as an individual module together with a necessary heat sink. The module is mounted externally to the electronic switch housing and at a place within the equipment whose motor is to be controlled or regulated. In this manner, it is possible to cool the power semiconductor adequately, for example, by attaching it to the housing wall, etc., so that damage during operation is largely eliminated.

The known construction of, for example, the CAPAX electronic switch is such that an actually closed housing is not provided. In addition to the power transistor component, the housing is constructed by fitting together three distinctly different housing components. For example, mounted on the known housing there is a separate right/left switch, which itself is connected to the housing with two connectors along the outside of the housing and additionally with three further connecting leads, which must be routed from the housing to the individual module of the power transistor.

All electrical connections are direct whether internal or also leading to the outside, that is, to the source to the motor connections. This makes it necessary to introduce tinned wire ends into the housing through openings, in which the tinned wire ends are locked by latching tonques.

This is costly and not necessarily reliable, because such plug-in connections may become loose are cumbersome, and are not dust-proof so that dirt may enter the interior of the housing through the wire openings. Moreover, the housing is not designed to be particularly dust-proof.

The installation of such battery control switches on an electronic device is also complicated, expensive and, if for no other reason than because of the external, electrical connecting lines, not always sufficiently foolproof. Mistakes can occur if the personnel is not trained adequately. Furthermore, within the equipment supplied with such an electronic switch, there are a plurality of electrical connecting lines which run outside of the approximately box-shaped housing of the electronic switch, and can therefore also be subjected to interference or caused to malfunction.

The invention generally is directed to such an electronic switch for controlling motors of, for example, manually operated electrical equipment, the current for which is supplied by an appropriate source or batteries. However, it is self-evident that this is merely a preferred embodiment of the invention and that the use of such a switch with other battery-operated equipment and systems is also possible.

It would be desirable to provide a supply circuit powered by batteries, particularly for motor driving mechanisms, that accommodates within a closed, tightly limited switch housing a power semiconductor, which controls the load such as the motor, and which nevertheless ensures an adequate dissipation of heat.

SUMMARY OF THE INVENTION

One aspect of the invention is directed to dispose the power semiconductor, which usually has a comparatively high power dissipation, on a circuit board or printed circuit board, without causing local or general overheating phenomena or, under some circumstances, even the destruction of the power semiconductor.

Due to the intimate connection over a large area of the circuit board with a heat sink of equal size, a free and unimpeded transfer of heat from the circuit board to the heat sink becomes possible where the circuit board is a ceramic body. As a further step, this heat sink protrudes to the outside through a fitted opening in the housing that accommodates the whole of the electric circuit. The circuit board preferably is formed from a ceramic substrate and will be referred to as such hereafter without, however, limiting the scope of the invention.

By these means, adequate cooling of the whole is achieved either by the free circulation of air, which exists here, or by making use of the possibility of bringing the heat sink, in turn, into thermally conducting contact with other elements, plates, the inside of housings, etc., which are present. For example, thermally conducting contact is made with the other elements, plates, inside of the housings, etc. which are present in the equipment driven by the electrical circuit of the inventive apparatus or within the equipment housing of such an apparatus.

It is advantageous to glue the heat sink to the back of the ceramic substrate with thermally conductive adhesive. Not only is the area of the IC on the ceramic substrate, which contains the power semiconductor usually in the form of MOS-FET that is designed to be appropriately powerful, cooled locally by these means, but also the other circuit elements, which are on the ceramic substrate, such as quenching diodes, etc., are cooled.

Experiments have shown that, by means of such a design of the control apparatus and the incorporation into an undivided, closed housing together with the remaining, participating circuit components, overheating need not be feared even in extreme control cases. Furthermore, in an advantageous refinement, the "intelligence" of the IC containing the MOS-FET is designed so that, as the temperature limit, which lies, for example, between 140° and 170° C., is approached and possible exceeded, the IC itself, in the sense of a temperature control, reduces the load current supplied by it to the load, usually an electric motor. Due to this temperature adjustment, the whole of the electronics is protected against excess temperature. Preferably, the current is regulated and the temperature limited by the method of pulse-width modulation, according to which the current is increased or decreased by broadening or narrowing current pulses of constant height and frequency. When the internal temperature control sets in, the IC merely decreases the pulse width only by as much as is required for its thermal well-being.

It is advantageous that such a decrease in power, which is accomplished independently of the consent of the operator of the equipment, for example, a drill or screwdriver, be hardly noticed by the operator. This takes place assuming that regulation of the temperature has set in, because the operator must have worked already at the upper limit of the controlled operation with the equipment, because the temperature control otherwise would not have set in. If the hardly noticeable effect of the temperature control is undesirable in such a case, the operator need merely press the trigger handle with greater force, whereupon the whole of the control apparatus reaches the electrical by-pass position, in which the electronic system is bridged by a switch and the output connections of the supply are connected directly with the input connections of the motor. In this case, the full power is then applied to the motor. At the same time, the greatest possible opportunity exists for cooling the electronic system, which is no longer under load.

It is also particularly advantageous to connect the second leg of the contact strip angle connectors, which stand out perpendicularly from the ceramic substrate circuit board, directly with internal contact strips in the form of cross member-like metallic tape material, which runs in the housing, and to see to the relative positioning of the individual circuit components in the housing by these means.

The electrical circuit may contain a clock oscillator for determining the frequency of the current pulses of constant height supplied while controlling the external load. The modulation of the amount of current is determined by broadening or narrowing the current pulses in accordance with the potentiometer setting, which is determined by the position of the trigger.

BRIEF DESCRIPTION OF THE DRAWINGS

Embodiments of the invention are shown in the drawing and are explained in greater detail in the following specification.

FIG. 7 shows a highly simplified sectional view along the line 7—7 of FIG. 3, with part omitted, and illustrating the fastening of contact strip angles to the electronic hybrid circuit construction;

FIG. 8 shows a sectional view along the line 8—8 of FIG. 3, also with omitted parts to illustrate a contact piece guide in the area of the trigger and of the potentiometer slider;

FIG. 9 shows a sectional view along the line 9—9 of FIG. 4, illustrating the right-left switch;

FIG. 10 shows a partial sectional view taken along the line 10—10 of FIG. 9, with parts removed for clarity, illustrating the switch contact arrangement;

FIGS. 15b and 15c show detail side views of the elements shown in FIG. 15a; and

DESCRIPTION OF THE PREFERRED EMBODIMENT

Figure 1:
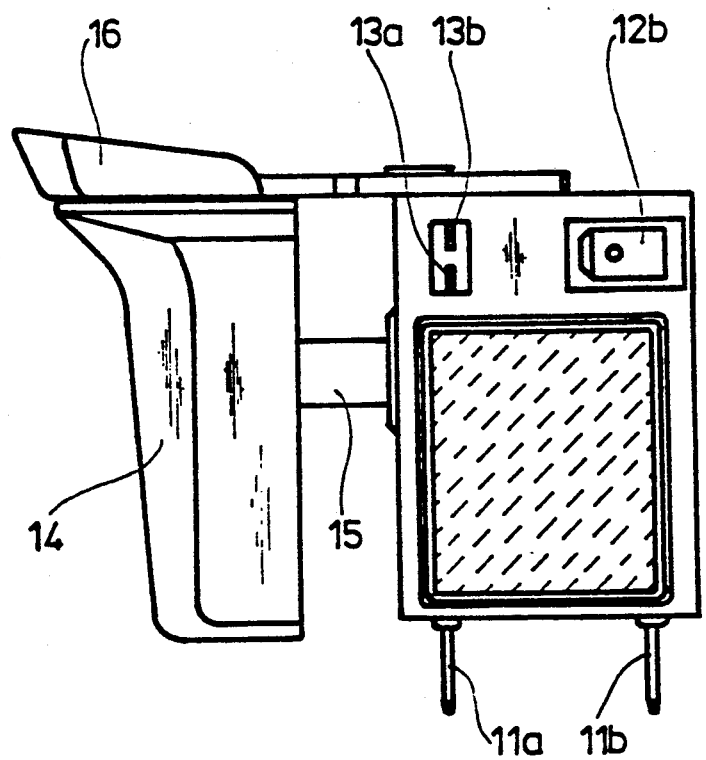
FIG. 1 shows a side view of an embodiment of an electronic switch of the present invention for battery-operated equipment with all working components in one common housing.

FIG. 1 shows that all the components required for the controlled (or optionally also regulated) supply of current to electrical equipment, for example, for controlling their rotational speed, are disposed in a standard, closed housing. Also included within the housing may be the electronic, high-power, semiconductor switch and the elements for reversing the direction of rotation of the equipment driven by the source.

This means that, contrary to previously known embodiments, the electronic switch has only and preferably four main contact connections that lead to the outside, namely the two connections 11a and 11b, which are to be connected with the source and depend from the bottom of the equipment in the embodiment shown. Two further contact connections 12a, 12b are provided which are located on the side wall adjacent the top, and form the motor connecting terminals. They connect with the right-left switch.

All the connecting contacts are plug-in connections, which have the shape of prongs. The contacts pass through the equipment wall and receive connectors in a sliding contact. In this way, it also becomes possible to have the electronic switch housing essentially dust-proof. The lead-through openings in the housing can be positioned close together. Alternatively, it is also possible to extrusion-coat the respective contact strips, which lead to the outside, with housing material.

If desired, a few additional connections can also be led to the outside. An example of these are two narrower contact plug-in connections 13a and 13b which are for light-emitting diode displays. One light-emitting diode color may be for showing the source voltage and one light-emitting diode color may be for showing the excess temperatures, which correspond, at the same time, to an automatic attenuation of the power output. This latter aspect will be described below.

Due to the special construction of the external contact connections in the form of plug-in prongs which may be bent in any manner desirable, as exemplified by the two motor connections 12a and 12b (see FIG. 2), adaptations to different spatial relationships are possible.

Figure 2:
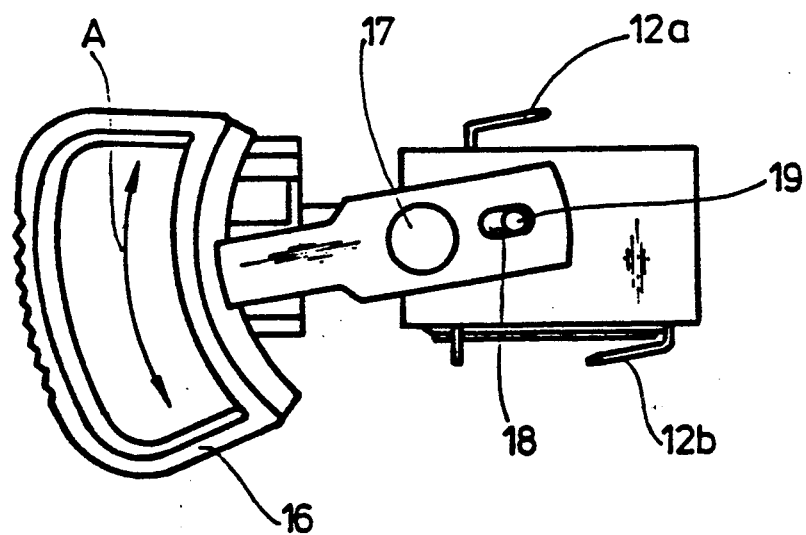
FIG. 2 shows a top view of the electronic switch of FIG. 1.

The right-left or rotatable switch lever 16 is above the starter handle or trigger handle 14, which is seated on a trigger shaft 15 in the housing. This lever 16 is mounted in a known manner as shown in FIG. 2, so that it can be rotated about a fixed axis 17 in the double direction of the arrow A. The lever 16 accommodates in an elongated hole 18 a switching pin 19, which operates a rocker arm 20 (FIG. 9) through a housing opening. Between the trigger handle 14 and the right-left switch lever 16, a mechanical connection (not shown) is provided, which is constructed so that the right-left switch lever 16 can be operated only when the trigger handle 14 is in the OFF position.

All the operating components for the electronic switch, which in some cases are very different, are contained within a single pot-shaped housing. The housing is closed off by means of a lid and the rectangular housing is divided in a plane parallel to its large cross sectional area. A wide hybrid module 22 is inserted in this housing 21 (FIG. 4) adjacent to the housing bottom wall 21a. Of this hybrid module 22, essentially only the ceramic substrate 22a can be seen in FIG. 4. Due to the larger base area made available by these means, this ceramic substrate 22a is able to accommodate all electric and electronic components, mainly by means of the conventional thick-film technology, which will be described below.

Figure 4:
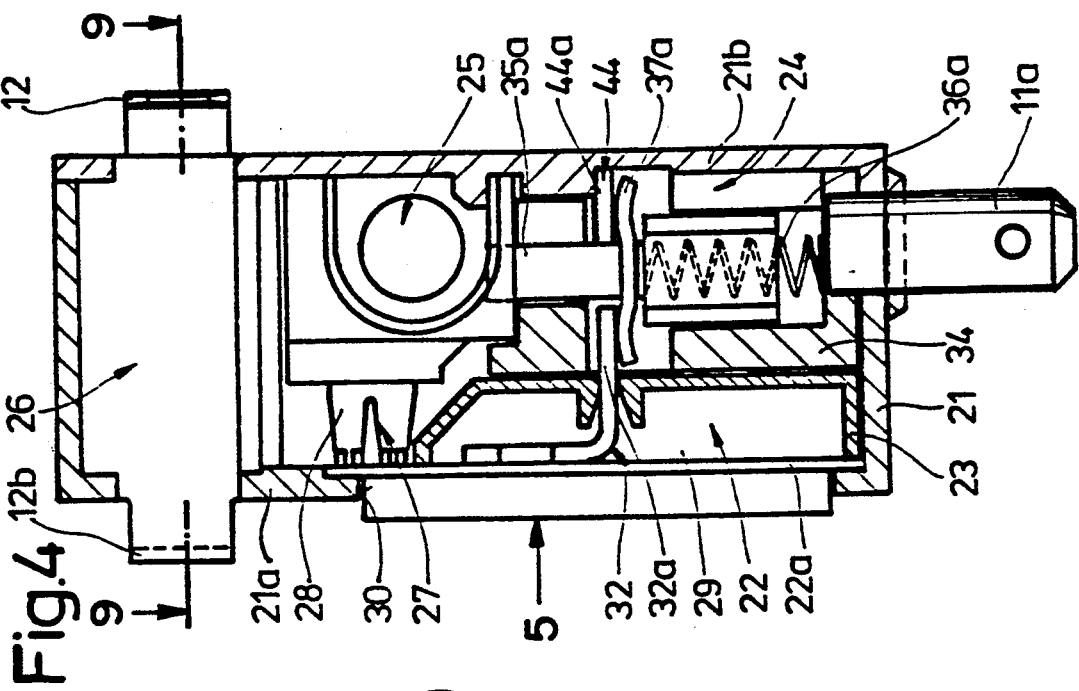
FIG. 4 shows a sectional view along the line 4—4 of FIG. 3, with parts omitted for the sake of greater clarity.

In the plane of FIG. 4 towards the right, a switch region 24, which extends up into the region of the trigger guide 25, adjoins the hybrid module 22 and sealing frame 23. Above the hybrid module 22 on the one hand and the switch region 24 and the trigger guide 25 on the other, there is the region 26 of the right-left switching, which extends over the whole surface, but is disposed within the undivided housing. As already mentioned, the plug-in prongs 12a, 12b for the motor connections extend outwardly from this region 26. Moreover, a potentiometer 27, which is indispensable for the accelerating function of the electronic switch, is disposed in the plane of FIG. 4 to the left of the region of the trigger guide 25 and is mounted on the ceramic substrate 22a of the hybrid module 22. The potentiometer is engaged by a bifurcated wiper 28, which is guided in a bearing in the trigger shaft 15.

In contrast to all previously known embodiments, the semiconductor, which may require high power dissipation because of the high current flow through the same, is disposed within the electronic switch housing. Moreover, in accordance with a preferred characteristic of the invention, the semiconductor is an IC (for example, in the form of a MOS-FET) on the plate of the ceramic substrate 22a.

In order to ensure adequate cooling for such a construction, an adequately dimensioned heat sink 29 is disposed, as shown in FIG. 4, on the other side of the ceramic substrate 22a. This is done, for example, by gluing the heat sink 29 with a thermally conductive adhesive to the back of the ceramic substrate. This heat sink 29 can be a thick copper plate with the dimensions of the ceramic substrate or of the hybrid module 22 formed by this substrate. The heat sink 29 extends to the outside through an opening 30 in the bottom of the pot-shaped part 21 of the housing of the electronic switch.

By appropriately placing further coolants against this heat sink 29 from outside, such further coolants may be brought to the electronic switch housing to ensure in this manner a completely adequate dissipation of the heat, which is generated mainly by the semiconductor. This may be done without having to, as is otherwise necessary, dispose or, perhaps, bolt down the power switch tightly in order to effect good heat dissipation over a plurality of lead wire connections in a different part of the housing of the associated equipment.

The dissipation of heat over the generously dimensioned heat sink, which forms one side surface of the electronic switch housing (with the exception of the right-left switch region lying above it), is not critical and can be designed appropriately. It is therefore possible, in an undivided, compact housing to exert only very little effort for connecting the remaining four main connections through the plug-in prongs and still accommodate all working components in this one housing. Accordingly, aside from a significant installation simplification, the construction, costs, space requirements and the universal adaptability of the electronic switch may be configured to the best advantage.

As a safety precaution, and this will be dealt with below in the discussion of the electronic circuit, the IC, comprising the semiconductor switch (MOS-FET), is designed so that, when a specified temperature is exceeded under load, its power output is automatically reduced, as is proper for its performance data. Normally, however, as confirmed by experiments, such a reduction does not occur at all in practical operations. This is because, under an extremely high load, the IC circuit is bridged by a by-pass switch, which is customary for such electronic switches of battery-operated equipment, and, on the other hand, under controlled operation, adequate cooling capacity is available because of the design with the heat sink 29 that extends to the outside, so that the cut-off system need not respond.

Since the switch region 24 is adjacent to the hybrid module 22, contact strip angle connector 32 is electrically connected in an appropriate manner with the connections (as described below) on the substrate which are fastened, usually by soldering, on the ceramic substrate 22a (this is shown best in FIG. 4). Particular to their contacting surface on the ceramic substrate 22a, these contact strip angle connectors pass from the hybrid module 22 through the casting composition within the sealing frame 22 to the outside. The external surface serves as contacts for the individual switches of the switch region 24.

Figure 16:
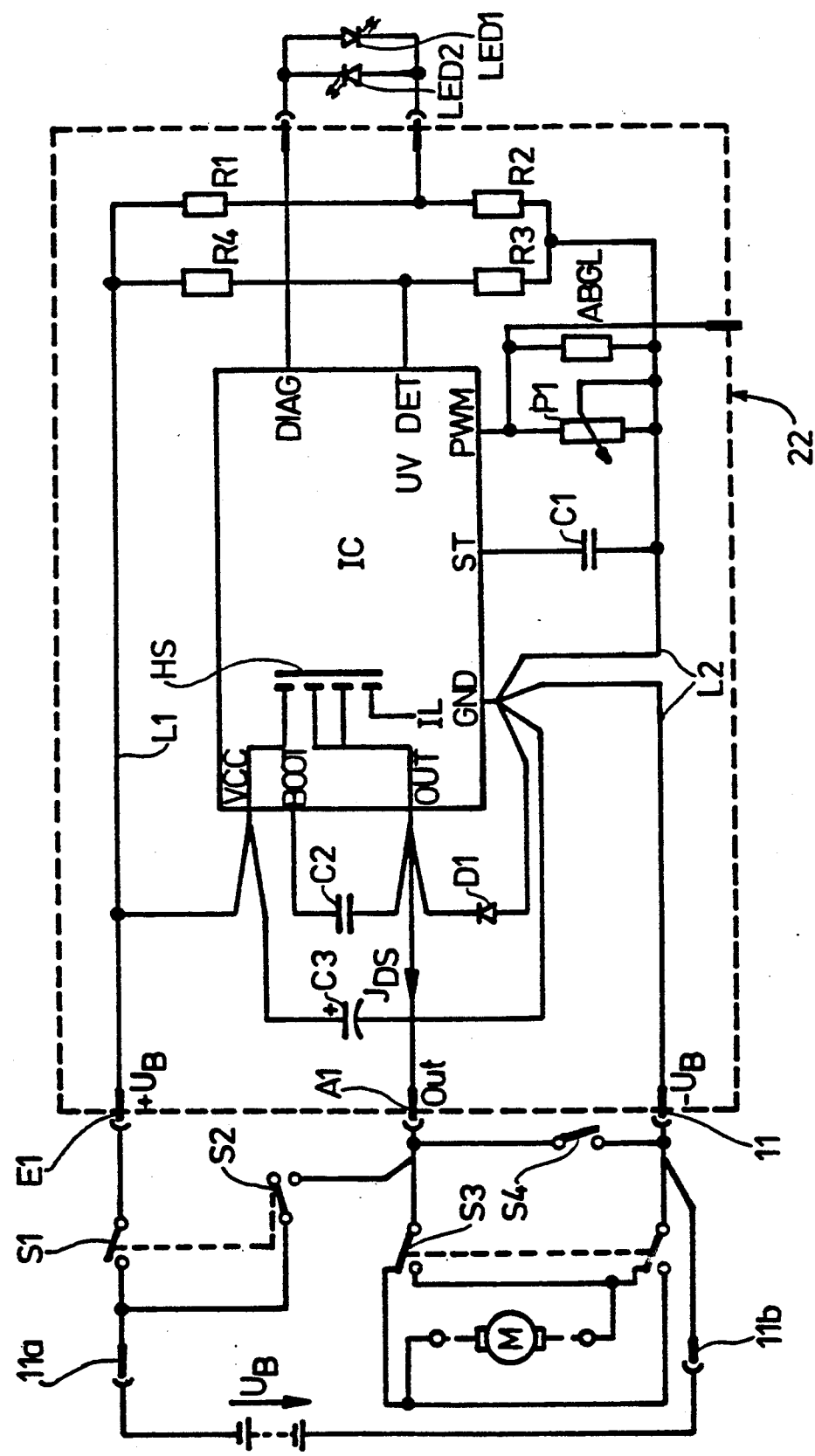
FIG. 16 shows the electrical circuit wiring diagram of the electronic switch.

In order to differentiate better between important individual switches that are provided for the construction of the electronic switch for the battery-operated equipment and to put them in their proper place in the overall concept, it is meaningful, to begin with, to go briefly into the electrical construction by means of reference to FIG. 16.

The heart of the hybrid module 22 (bounded in FIG. 16 by a broken line) is formed by an IC, which also contains the semiconductor power switch HS, usually an MOS-FET. The internal construction of the IC is or can in any case be of conventional structure, as used, for example, to control the speed of a direct-current motor M and is explained below to the extent necessary.

The d.c. supply voltage $U_B$ from the battery is applied across the already mentioned prongs 11a, 11b (labeled as in FIGS. 1 and 2) to the electronic switch. The contact connection 11b, which is connected with the negative pole of the supply source, is connected through to the negative ground bus bar L2 of the circuit. The positive lead is labeled L1.

A first ON/OFF switch S1 is provided, which connects the positive input contact connection at the prong 11a with the hybrid module 22 or with the circuit formed by this component. The plus pole, while bypassing the control circuit, is connected directly with one motor connection (corresponding to the output connection A1 of the control circuit) through a full-load switch S2, which bridges the input connection E1 and the output connection A1 of the hybrid module.

Another switch S4 is provided, which short circuits the motor connection terminals between the output connection A1 of the control circuit and the ground connection L2. This switch is referred to, in accordance with its action, as a brake switch or as a short circuiting switch.

Finally, a fourth switch S3 serves for the right-left switching of the direction of rotation of the motor and has appropriate double contacts.

Of the switches mentioned, the input switch S1, the full-load switch S2 and the brake switch S4 are switched by operating the trigger 14, while the right-left switch S3 is operated separately by the lever switch 16 above the trigger handle 14.

Figure 3:
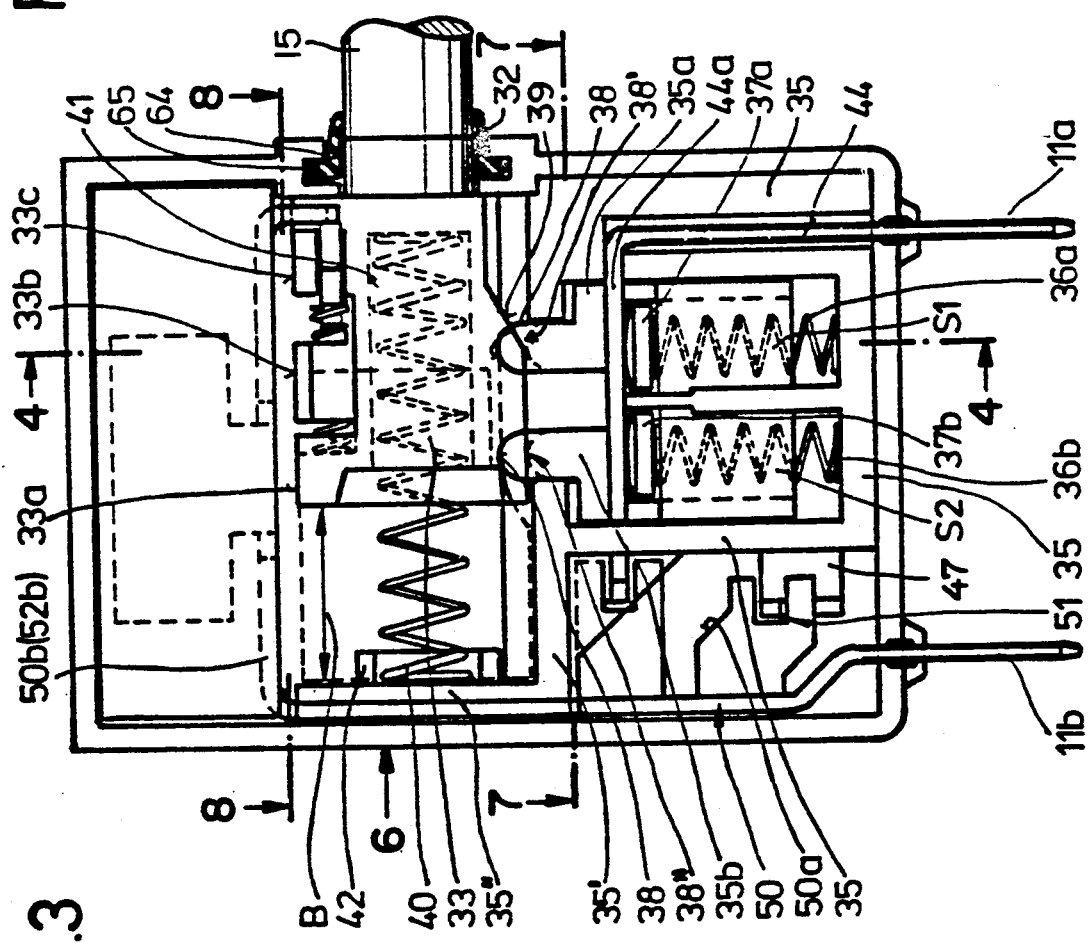
FIG. 3 shows in greater detail the electronic switch of the present invention from a side opposite to the side view of FIG. 1, with the housing cover removed.

As shown in FIGS. 3 and 4, input switch S1 and full load S2 are disposed below the trigger guide 25. FIG. 3 shows the position of the trigger guide, when the trigger handle is released in the OFF position of the switch.

The trigger shaft 15, which can pass through the housing inlet opening 32, for example, changes considerably in shape, external dimensions and structure within the housing, in order to be able to fulfill the various tasks.

As shown in FIGS. 3 and 8, the trigger shaft 15 changes into a roughly rectangular inner trigger part 33, which is provided with bevels and notches. Below the trigger part 33 shown in FIG. 3, there are elements comprising the input switch S1 and the full load switch S2, which are inserted in and held by internal wall formers 35 that are unitary with the housing 21. These structures are disposed next to one another and comprise, in each case, a switch pushrod 35a, 35b, each of which is put under tension in the upwards direction in the representation of FIGS. 3 and 4 by a strong tension spring 36a, 36b and supports a contact bridge 37a, 37b.

Each of the switch pushrods 35a, 35b has an upper sliding surface 38, which is in operative connection at the inner trigger part with a lower cam guideway, comprising an inclined surface 39. As shown in FIG. 3, the inner trigger part 33 is forced by its own, strong tension spring 40 to the OFF position of the switch at the right stop position, whereby the two switch pushrods 35a and 35b are pushed downwards against the force of their own springs. In this position, the upper sliding surfaces 38 of the two switch pushrods are in position 38' or 38", which is indicated by a dash-dot line. The length, through which the inner trigger part 33 can be moved freely, is indicated in FIG. 3 by the distance B. If now, the inner trigger part 33 is gradually pushed to the left as taken in FIG. 3 by exerting pressure on the trigger handle 14 and the trigger shaft 15, then the surface 38 will ride on the inclined surface 39. Accordingly, the pushrod 35a will move upwardly thereby carrying along the contact bridge 37a. By these means, the first input switch S1 reaches its conducting closed position—the circuit of the hybrid module 22 is supplied with current and, at the same time, and this will be described below, the sliding potentiometer is activated by depressing the trigger further, so that output current for the motor M is made available as a function of the trigger position by the IC at the output A1 (FIG. 16).

If the trigger switch is depressed completely, that is, shifted into the left connection position of FIG. 3, then the second, full-load switch S2 is also closed. In this position, it bridges the electrical circuit of FIG. 16, as a result of which the full supply voltage of the source is supplied to the motor M.

The strong tension spring 40, which acts on the trigger, is guided over a large part of its length, even in the fully extended position shown in FIG. 3, in an appropriately shaped recess 41 in the inner trigger part 33 and is held on the opposite side by a cup-shaped, projecting holder 42.

Figure 15B:
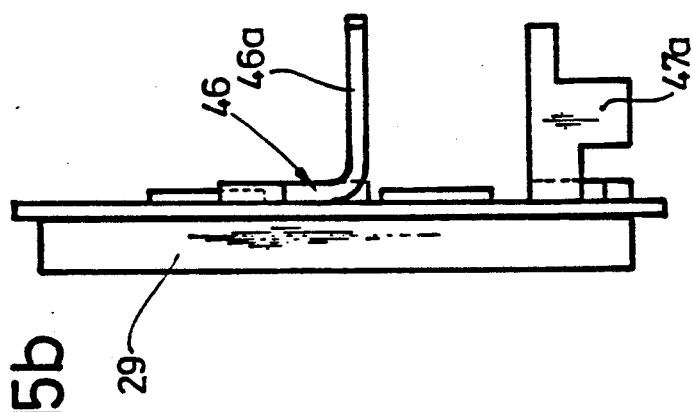
Figure 15A:
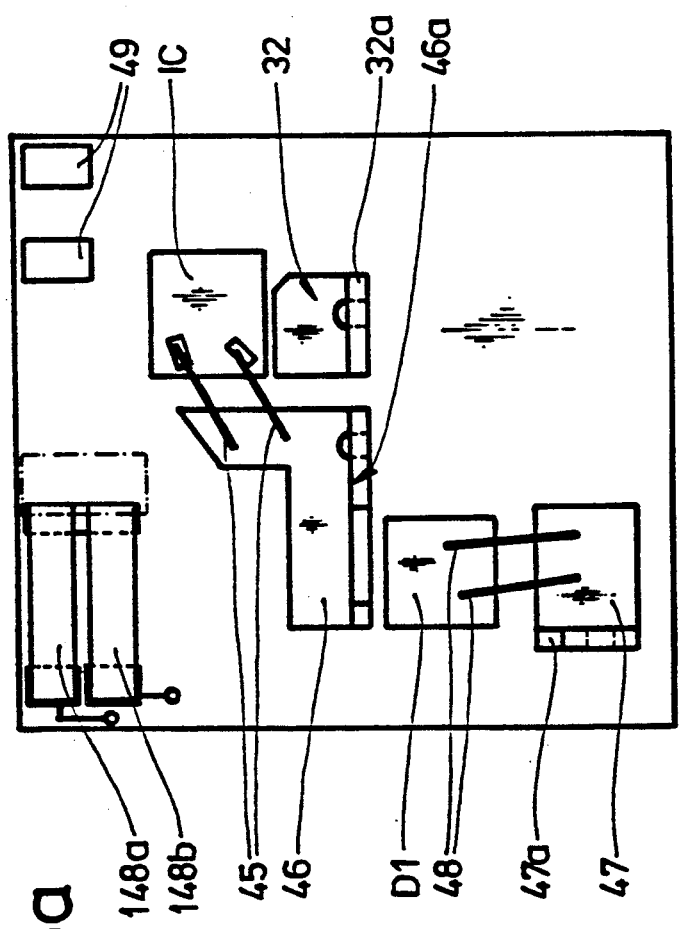
FIG. 15a shows a plan view of the arrangement of circuit components and contact angels on the ceramic substrate of the hybrid module.
Figure 15C:
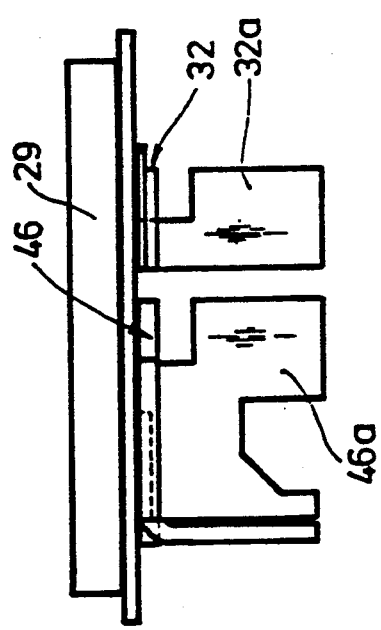

For a better understanding of the wiring diagram and in this respect also of the distribution of the individual components within the switch housing, the contact strip angle connection on the ceramic substrate 22a of the hybrid module 22 is explained in conjunction with FIGS. 15a, 15b and 15c.

FIG. 3 shows that the one-piece, input plug-in prong 11a (carrying the positive voltage from the source) connects with a first inner contact strip 44, which includes a horizontal bend 44a extending over both contact bridges 37a, 37b of the switches S1, S2 and in this way directly forms the respective input contact for these switches.

As already mentioned, the output contacts for these switches are formed directly by contact strip angle connectors, which extend from the substrate 22a of the hybrid module. FIG. 15a shows that a first contact strip angle connector 32 is disposed on the plate of the ceramic substrate 22a (aside from the other components, which need not be dealt with or which will be explained below). Together with a perpendicularly projecting leg 32a, this first contact strip angle connector 32 directly forms the inner, opposite contact piece for input switch S1. The positive supply voltage thus reaches the circuit of the hybrid module 22 through this contact strip angle connector 32 and is applied through the lower contact surface connection to the IC (which can also be designed specifically for the customer, should this be desired). This IC provides the desired control of the current (will still be explained). The output of the IC is applied through a thick wire 45 (preferably doubled, because of the high currents) to a second contact strip angle connector 46, the leg 46a of which also extends perpendicularly and forms the output connection A1 of the control circuit (FIG. 16) as well as the inner contact connection for the second full-load switch S2.

For the sake of completeness, it is pointed out that there is also the freewheeling diode D1 on the ceramic substrate 22a. In accordance with the circuit of FIG. 16, this freewheeling diode D1 is connected between the contact strip angle connector 46, by way of the substrate, and a negative or ground contact strip angle connector 47, via thick-wires 48. The further contact strip angle connector 47 for the ground connection also has a bent-up leg 47a. The leg 47a and the (double) leg 46a of the contact 46 each correspond to output A1 (FIG. 16) and form soldered junction connections for further inner contacts of the electronic switch, which will be described below. The free contact legs (32a, 46a, 47a) may penetrate through the casting composition of the housing to the outside or be guided through slotted openings in the sealing frame 23.

The construction of the ceramic substrate is completed by potentiometer tracks 48a, 48b which are printed on the ceramic substrate. Two (tinned) connection surfaces 49 for the LEDs noted above are also printed on the substrate and provide for the optional connection with the external plug-in connectors 13a, 13b of FIG. 1.

The further current conduction within the housing of the electronic switch is such that the circuit starting from the outer input plug-in prong (for the negative pole of the supply source) includes an inner contact strip 50 of comparatively complicated structure. An electrical connection 51 is first of all established between a first arm 50a, which projects from the contact strip 50, and the contact strip angle connector 47 of the hybrid module 22.

Figure 11:
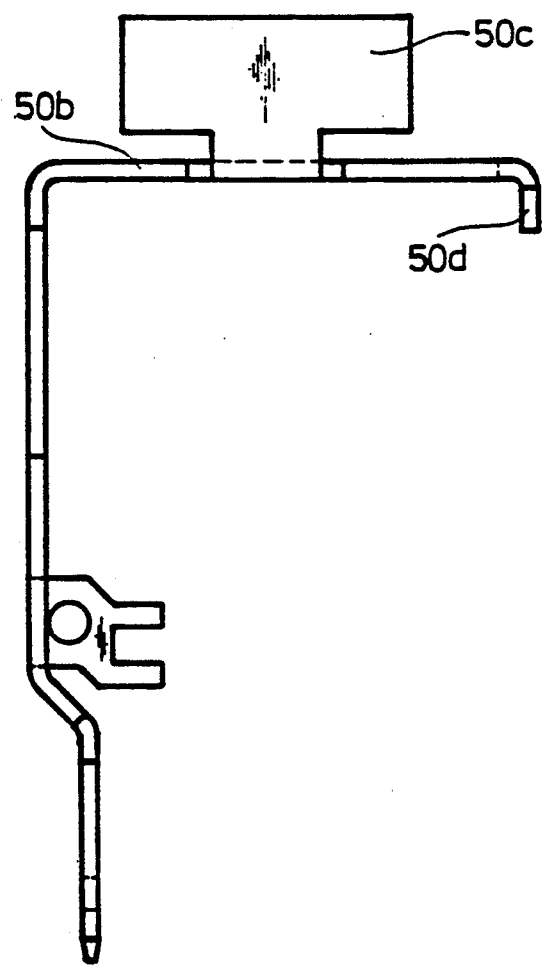
FIG. 11 shows a side view of the contact strip shown in FIG. 3.
Figure 12:
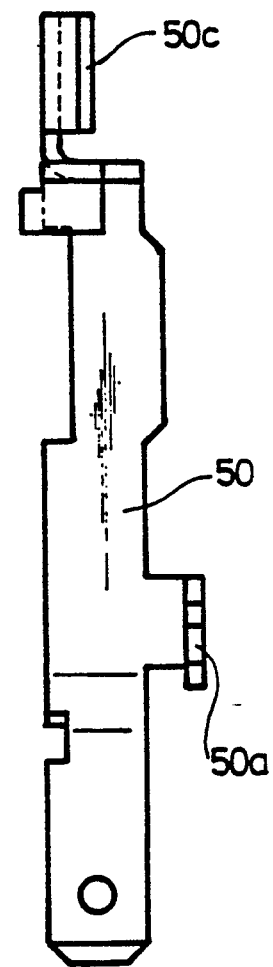
FIG. 12 shows a side view of the contact strip of FIG. 11.
Figure 13:
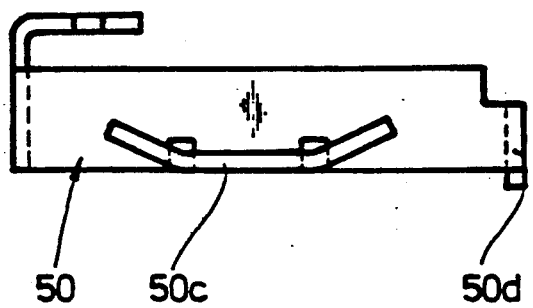
FIG. 13 shows a top plan view of the contact strip of FIG. 11.

The contact strip 50 also extends upwardly (FIG. 6) along the inner wall of the housing of the electronic switch and then forms a horizontally bent leg 50b, as can be seen best in the FIGS. 11, 12 and 13. In the upper region of the housing, this section of the contact strip fulfills two additional tasks. On the one hand, a flat, bent lug 50c, which is bent up from the horizontal leg 50b, forms the one (negative) connecting pole for the right-left switch in the head of the electronic switch housing. On the other hand, a short leg 50d downwardly bent at the end of the inner contact strip 50 forms a first contact for the brake switch S4, which will be described below (see FIG. 8).

Figure 6:
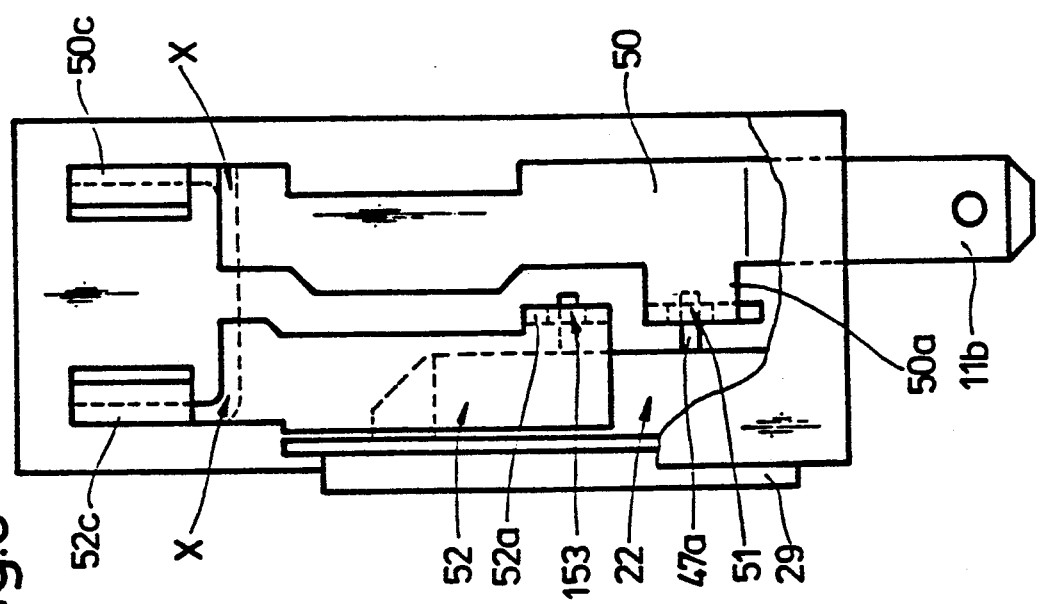
FIG. 6 shows a diagrammatic side view from the direction of arrowhead 6 of FIG. 3, with cut-away wall sections showing the path of the contact strips in this area along the narrow transverse side of the electronic switch housing.
Figure 14:
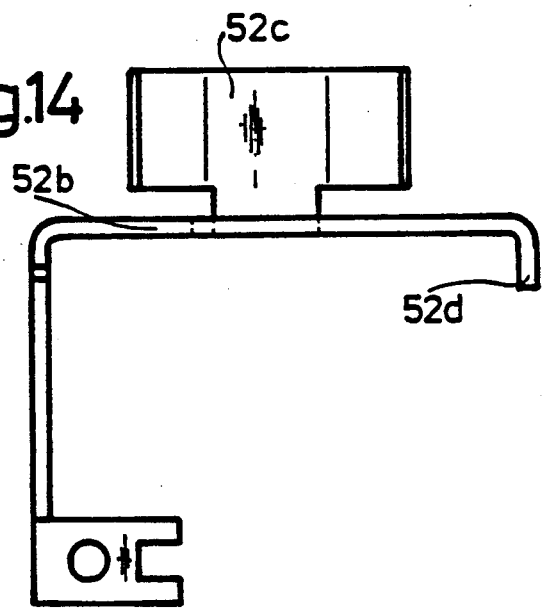
FIG. 14 shows a side view of a second, shortened contact strip shown in FIG. 6.

In the most general case of a control voltage, clocked by the IC and made available to the motor (in controlled operation and with the full-load switch S2 opened), the control voltage is applied from the output contact strip 46a to a further inner contact strip 52 within the electronic switch housing. This second contact strip 52 is shorter than the contact strip 50, because it does not have to extend to the outside. As shown in FIG. 6 a further electrical connection 153 is provided which comprises the connection (preferably by soldering) of a transverse leg 52a of the contact strip 52 with the leg 46a of contact strip 46. Strip 52 is positioned adjacent to and extends parallel with strip 50 and is formed complementary thereto and functions in the same manner. That is, strip 52 includes an upper horizontal leg 52b (FIG. 14) and wide lug 52c that is bent upwards therefrom. The strip ends in a downwardly bent piece 52d, which acts as a second contact for the brake switch S4 (FIG. 8).

The brake switch S4 itself, with its bridge-shaped contact piece 53, is supported at the inner trigger part 33, where the contact piece 53 (FIG. 8) is movably held by a cover 54 for the trigger part 33 and biased to the right in the plane of the drawing of FIG. 8 by its own, small tension spring 55 up to an inner stop (not shown) on the trigger part 33.

It can be seen that the short-circuiting switch S4 opens when the trigger guide moves even ever so slightly towards the inside, that is, even before the input switch S1 can close its contacts. On the other hand, the slight inherent mobility caused by the tension spring 55 against the short-circuiting switch S4 ensures that the electrical contact between the bridge-shaped contact piece 53 and its two opposite contacts 50d, 52d (originating from the inner contact strips 50 and 52) ensures under all conditions in the OFF position of the trigger that the contact piece 53 is biased to the right stop position of the inner trigger part 33 and makes satisfactory contact. If then the equipment is started by depressing the trigger once again, the bridge-like contact piece 53 reaches a stop wall 56 corresponding to its inner shape (broken line in FIG. 8), the contacts become disconnected and, as a next step, the input switch S1 closes.

The angular shape of the potentiometer slider 28 can be seen in FIG. 8. This potentiometer slider 28 slides along the potentiometer tracks 48a, 48b on the ceramic substrate 22a and connects these two tracks together, so that the potentiometer function for the assumed rotational speed control of the battery-supplied equipment results. This potentiometer function is indicated at P1 in FIG. 16.

FIG. 7 shows more clearly the position of the two inner contact strips 50 and 52 with their respective lateral projections, the two connecting regions (manually soldered connections 51 and 153), as well as the hybrid module 22, comprising the ceramic substrate 22a with the two contacts for the contact legs 32a, 46a forming the switches S1 and S2, and the sealing frame 23. It can be seen that the plate of the ceramic substrate 22a lies sideways on the inner opening edges 30a of the bottom cutout 30 of the housing and that only the heat sink 29 protrudes from the housing for further connection and dissipation of heat. The housing is closed off by a cover 21a. The individual parts of the electronic switch are constructed and sized so that the installation can proceed from the side of the housing for which the cover has been removed from the box-shaped housing. Installation is done in such a manner that these parts can be stacked or inserted consecutively in the housing, so that, finally, an automatic installation is also possible, should this be so desired.

The total construction of the electronic switch is completed by forming the right-left switch, as can be seen best in FIG. 9. An internal, partial housing 57 for the right-left switch S3 is provided in the upper part of the housing 21. This internal, partial housing accommodates contact strips and contact strip angle connectors for the right-left switching, as shown in FIG. 10. The internal partial housing 57 ensures the relative position of the switch structures for the right-left switching, which can be best seen in the plan view of FIG. 9. The contact lugs 50c and 52c form the power supply and bring it to the top—the contact lug 50c for the ground connection and the contact lug 52c with respect to the regulated d.c. voltage supply as a positive voltage connection or full supply voltage when switch S2 is closed.

The two contact lugs 50c and 52c are opposite one another and have a partial half-moon shape. Furthermore, two movable rocker contacts 58a and 58b are provided, which are in continuous electrical contact with respective inner bent-arm terminal angles 59a, 59b, which, in turn, extend preferably in one piece to the outside to the plug-in prongs 12a, 12b, which lead to the motor connections. Here also, the partial housing 57 is configured to approximately fix and position these switching elements. The rocker contacts 58a, 58b have an approximately hemispherically curved shape and are each reclined in bifurcated end regions 60 in the inner bent-arm terminals. It can be seen that, depending on the angular position of the rocker arm 20, which can be rotated in accordance with the double arrow C, the rocker contacts 58a, 58b, are pushed in opposite directions, to alternately make contact with the contact lugs 52c and 50c. Accordingly, the polarity of the output voltage at the output prongs 12a, 12b changes depending on the position of the rocker arm 20.

Supported within the rocker arm 20 are thrust pieces 62, which are biased outwardly by both on both sides by means of small springs 61, so that there is satisfactory contact between the rocker contacts and the contact lugs 50c, 52c.

Figure 5:
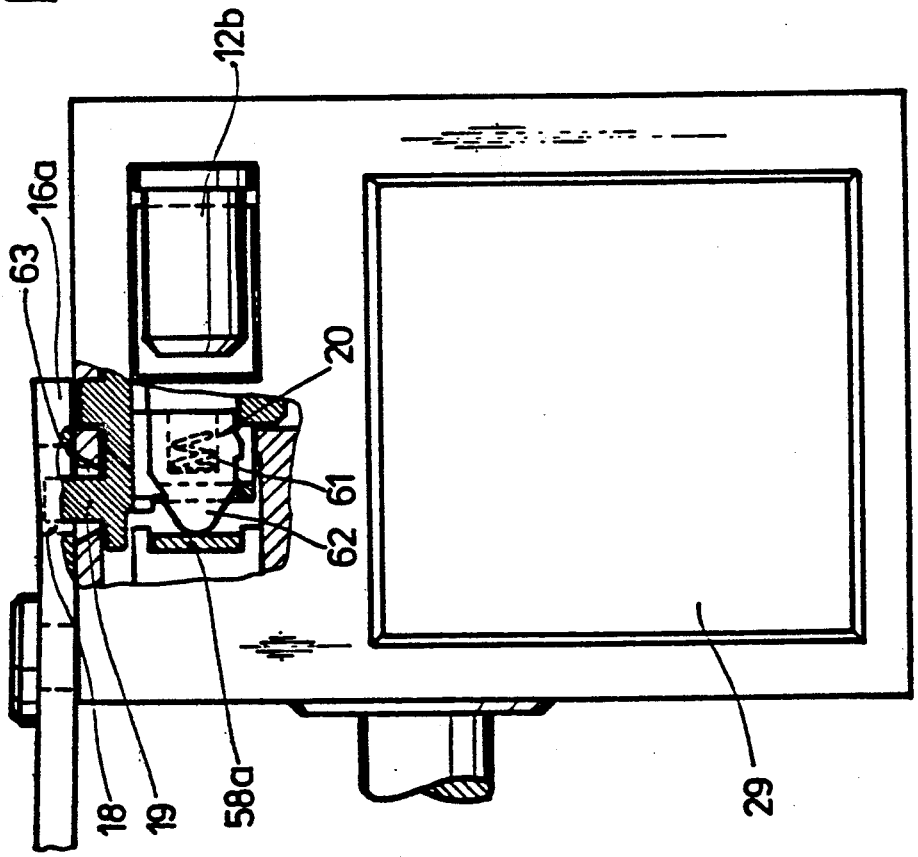
FIG. 5 shows a side view from the direction indicated by arrowhead 5 of FIG. 4 with a partial sectional representation in the area of the upper left/right switching.

Switching the rocker arm 20 to its other angular position by means of the lever switch 16 can best be understood by reference to FIG. 5. The pin 19 which extends through opening 63, is connected to rocker arm 20 and is received in elongated opening 18 of the extension 16c of lever 16. Movement of the lever to the right or left effect concurrent movement of the rocker arm. The integration especially also of the right-left switching area within the closed housing for the electronic switch is particularly advantageous, because all working components are integrated in this manner without the expense of external wiring in an unusually compact construction, which is sealed from the outside. Thus, no foreign objects or dust will penetrate into the interior of the switch, even under rough operating conditions, because the plug-in prongs extend through the walls of the housing and are sealed pursuant to the invention. The construction in the area of the trigger guide is therefore completed by an additional seal 64 (FIG. 3), which is disposed in a sealing groove seat 65 in the region of the feed-through of the trigger shaft 15 into the interior of the housing and which surrounds this shaft and seals.

A further advantageous refinement arises due to the construction of the inner, strong metallic, tape contact strips. Any force tending to deform, which the very strong trigger spring could exert, for example, on the housing walls, is, so to say, absorbed in the following manner.

As can best be seen in FIG. 6, the inner contact strips 50 and 52, which practically fill up the narrow transverse side of the housing on the inside, run from the bottom to the top. From each of the contact strips 50 and 52, a horizontal leg 50b, 52b branches off at the level marked with an X. The horizontal leg 50b, 52b extends transversely over the whole width of the housing until they form, in one piece, the respective downwardly bent short contact legs 50d, 52d. The main transverse leg 50b, 52b therefore runs parallel to the tensioning spring 40 for the trigger. When the trigger handle 14 is released, the inner trigger part 33 with the brake switch S4 supported by it lies, relieved of all stresses on it, by way of the contact bridge 53 against the short contact legs 50d, 52d. It can therefore be seen that the trigger spring 40 is supported (indirectly) on the metallic contact strip on both sides, since the cup-shaped holder 42, as a molded plastic part, lies at least on the upwardly extending portion contact strip 50. The trigger spring 40 abuts at least one of the contact strips and the effects of the spring are reliably kept away from the housing.

It should also be mentioned that the individual components within the rectangular, box-shaped housing 21 are positioned and held by housing inserts, which have already been mentioned briefly, and consist of cross member-like recesses, parting walls and partitions. For example, the dividing wall of the housing or insert 35 for switches S1 and S2, together with a preferably one-piece, integrally molded, inner, transverse dividing wall 35', extend in the plane of the drawing of FIG. 3 at first to the left and then, as a perpendicular leg 35'', towards the top. Thus, the cup-shaped holder 42 for the trigger spring 40 is also formed on the insert 35, while at the same time the contact strip 50 is covered by the insert.

The IC module 22 with the heat sink 29 extending to the outside is thus inserted first into the box-shaped housing below the region of the right-left switch. The inner, multi-walled housing structure 35, 35', 35'', which, in turn, accommodates the pushrods 35a, 35b, including the switching mechanism and the tension springs 36a, 36b of the two switches S1, S2, is placed on the sealing frame 23 of the of the IC module 22. Above the switches S1, S2, there is the inner trigger part 33, the upper edge of which, at the same time, forms sliding surfaces 33a, 33b, 33c, with which the trigger part 33 slides along the lower surfaces of the transverse contact strips 50, 52. That is, part 33 slides along transverse legs 50b, 52b.

Above this, there is then the insert part of the housing 57 for the right-left switching. It can be seen from FIG. 9 that this part of the housing is provided with walls 57a, 57b. Appropriate openings 66 are provided either in the housing 21 or the cover 21a which is received therein with a tight fit to maintain the interior free of duct. The prongs 12a, 12b extend through the openings to provide the external motor connections.

With respect to the hybrid module 22, the following can additionally be noted. A ceramic substrate of aluminum oxide of specified thickness is used. Printed conductors are applied on the substrate by a screen printing method. Resistances and potentiometers can likewise be applied by screen printing methods or realized as SMD components, as can capacitors also. The contact strip angle connector 32 serves to supply voltage ($+U_B$ connection) to the hybrid and, at the same time, functions as a fixed contact for the input switch S1. The contact strip angle connector 46 serves as an output connection for the circuit and, at the same time, as a further fixed contact for the full-load switch S2 which functions as a bypass switch for the IC. The upright leg 46a of this contact strip angle connector 46 is constructed as a double leg, in order to provide, at the same time, a place for establishing a connection with the shorter contact strip 52 by soldering manually. The second place for soldering manually is then formed by the upright leg 47a of the contact strip angle connector 47 for the ground connection of the hybrid.

A connection with the light-emitting diodes, which was briefly mentioned above and is used, for example, for indicating an excess temperature and an undervoltage, can be established with leaf springs, which lie resiliently on the connector surfaces 49 for the LEDs.

The two potentiometer tracks 48a, 48b are connected by the bifurcated wiper 28 and, as the wiper path increases, are increasingly bridged down to zero resistance. In this respect, no wiper tap is provided and the potentiometer functions as a variable resistance.

In conjunction with the circuit of FIG. 16 and the construction discussed above, it can be noted that, by closing the input switch S1 as the trigger handle 14 commences to be depressed, the electronic system is put into operation. This arises because the negative terminal of the battery or source is connected through the contact strip 50 with the external connection corresponding to the plug-in prong 11b.

The hybrid module is controlled by the method of pulse width modulation; the current supplied to the motor over the right-left switch is increased or decreased by widening or narrowing the current pulses of otherwise constant geight and frequency. The frequency of oscillation of the current pulses is determined by the capacitor C1 of FIG. 16. It can amount to 22 kHz for a selected embodiment. However, this value is given by way of illustration and not by way of limitation.

The pulse width is controlled with the potentiometer P1. The value of the resistance and, thereby, the voltage at the PWM input serves as a threshold for a voltage occurring at a sawtooth generator input ST.

The construction of the remaining circuit elements, which are grouped about the IC control module, is completed by a freewheeling diode D1, which serves to protect the electronic system when the source is switched off by the input switch S1. The capacitor C3 smooths voltage pulses occurring due to the inductive resistances of the line and any high current pulses, and protects the IC against overvoltage. The LED1 is illuminated when the supply voltage of the source falls below a certain value, which is determined by the two resistances R3 and R4 and the LED2 signals any overheating of the electronic system. The resistances R1 and R2 limit the diode current flowing through the light-emitting diodes LED1 and LED2.

It has already been mentioned above that the control circuit introduces a regulation of the current by limiting the temperature. If the IC circuit module reaches a certain temperature, which may lie, for example, between 140° and 170° C., then LED1 lights up. At the same time, the temperature control mechanism reduces the pulse width by an amount that varies with the chip temperature. This temperature control mechanism protects the whole of the electronic system against excess temperature. However, experiments have shown that this temperature control mechanism practically never responds under normal operating conditions because of the very effective cooling. It can anyhow be switched off arbitrarily by changing over to the full-load operation; at the same time, this gives the IC the opportunity to cool off correspondingly.

What is claimed is:

1. An apparatus for controlling operation of battery operated equipment, the apparatus comprising: a closed housing (21) having an opening; an external, displaceable, trigger handle (14) on the housing; and an electrical circuit means for controlling an amount of power to be supplied to an equipment motor, the electrical circuit means including a plurality of circuit components which include a potentiometer with at least one power semiconductor responsive to adjustment of the potentiometer which adjusts in response to displacement of the trigger handle, the power semiconductor controlling the flow of current to the equipment motor and being part of an integrated circuit (IC) which in turn is disposed within the housing on a circuit board, the circuit board being in contact with a heat sink (29) which protrudes to the outside through the opening in the housing (30).

2. The apparatus of claim 1, wherein the circuit board is in the form of a ceramic substrate (22a), the electrical circuit means including circuit components on the circuit board, the power semiconductor being disposed in such a manner that heat, and particularly heat generated by the IC due to energy losses, is carried off over the ceramic substrate by the heat sink (29), which is a thermally conductive plate element having a thickness which allows the heat sink to protrude to the outside through the opening in the housing.

3. The apparatus of claim 2, wherein the integrated circuit (IC) has an internal current control based on a temperature limitation such that when a specified limiting temperature range is exceeded, an amount of current flowing through the power semiconductor decreases.

4. The apparatus of claim 2, wherein printed conductors and resistances, including potentiometer tracks, are applied on the ceramic substrate (22a), further comprising a sealing frame (23) which covers the electric circuit elements on the ceramic substrate (22a) by a casting composition.

5. The apparatus of claim 2, forther comprising contacts and connectors for conducting current on the ceramic substrate (22a), the contacts and connectors being mounted on the ceramic substrate (22a) with wire bonding between the contacts, the circuit components including a freewheel diode D1 and the IC module, the connectors (32, 46, 47,) having legs (32a, 46a, 47a), which stand away from the ceramic substrate (22a), serving to form an outer connection.

6. The apparatus of claim 2, wherein the electrical circuit means contains a clock oscillator for determining frequency of current pulses of constant height supplied while controlling external load, a modulation of the amount of current being determined by broadening or narrowing the current pulses in accordance with a setting of the potentiometer, the setting being determined by a relative position of the trigger.

7. The apparatus of one of the claim 1, wherein all circuit components of the electrical circuit means, including the power semiconductor (MOS-FET HS) are disposed within the closed housing (21), which is perforated over a large area only on one side by the heat sink (29).

8. The apparatus of claim 7, wherein the housing includes a right/left switch region (26) which has an internal partial wall structure (57) and a bottom wall (21a), the housing (21) being box-shaped and havinga at least two parts, the two parts including an upper compartment which extends over the whole depht of the housing, the upper compartment including the right-/left switch region (26), the right/left switch region (26) having a bottom wall adjoining the bottom wall (21) of the housing, the hiusing containing a hybrid module (22), a spring, inner tigger region (25) extending over the hybrid module and adjoining the right/left switching region, the inner trigger region (25) having an inner trigger part (33) which is movable against the pressure of the spring, and a switch region (24) disposed below the inner trigger part and being positioned above the hybrid module (22) and being operable in response to displacement of the inner trigger part (33).

9. The apparatus of claim 2, wherein the switch region (24) comprises at least two switches and respective pushrod guides which are formed by the internal partial wall structure (35) for operating each of the switches and are responsive to the inwards motion of the trigger for sequentially operating the switches, the trigger having an inclined surface, further comprising switch pushrods (35a, 35b) each having a respective bearing with a cam sliding surface (38), and a tension spring (36a, 36b) for biasing the associated pushrod against the inclined surface (39).

10. The apparatus of claim 9, further comprising metallic contact bridges (37a, 37b) and stationary fixed contacts, the switch pushrods (35a, 35b) supporting the metallic contact bridges (37a, 37b), which connect with the stationary fixed contacts.

11. The apparatus of claim 7, wherein the housing has an interior and a rear surface, the right/left switch region having a top region, further comprising two plug-in prongs (11a, 11b) which protrude out of the housing to the outside through slots and are to be connected with battery connections which include positive and negative poles, the two plug-in prongs each extending further in the interior of the housing in one piece as respective contact strips (44, 50) formed from metallic tape material, a first of the contact strips (50) being connected with a negative pole running on the inside along the rear surface of the housing on a side averted from the trigger handle (14) and extend as far as the top region of the right/left switch region (26), a second of the contact strips being connected with a positive pole, further comprising an angle-shaped leg (44a) which forms fixed contacts directly for both switches (S1, S2) with the second of the contact strips (44) thas is connected with the positive pole.

12. The apparatus of claim 11, further comprising a trigger guide, wherein a further, inner contact strip (52), running parallel to the first contact strip (50) for the negative connection, is current controlled by the hybrid module (22) and, in the event that the latter is bridged for the positive connection, the contact strips each comprising a respective stamped-out and appropriately bent, single-piece sheet metal part which runs along the rear surface and parallel to one another upwards to the right/left switch and, together with an angle-shaped transverse leg (50b, 52b), extend over a whole width of the housing between a trigger guide (25) and the right/left switch region (26) up to the penetration region of the trigger shaft (15) into the interior of the housing.

13. The apparatus of claim 12, further comprising a short circuiting switch (S4) which has contact ends and is supported by the inner trigger part (33), the short circuit switch switching in response to displacement of the inner trigger part (33), the contact strips being parallel to form partially bent lugs (50c, 52c), which extend upwards into the internal partial wall structure (57) of the right/left switch region, and, have downwardly bent, short end legs (50d, 52d) whose end region form fixed contacts for the short circuiting switch (S4).

14. The apparatus of claim 13, wherein the short circuiting switch (S4) has contact ends and a contact bridge, the trigger shaft (15), which is surrounded at a poin of penetration into the housing by a seal (34), extending over an interior of the housing into an approximately rectangular shape of the inner trigger part (33), the inner trigger part (33) extending downwards towards the cam surfaces (38) of the pushrods (35a, 35b) to form an inclined surface (39) with a facet that has a middle part which accommodates in a borehole (41), the tension spring (40) being supported at the rear surface of the housing, the contact strip having an inner course covering the tension spring, the inner trigger part extending upwards adjacent to the transversely guided contact strip legs (50b, 52b) to support the contact bridge (53) of the short circuitinng switch (S4 under the tension of the tension spring, the inner trigger part (33) being displaceable into a releasing poition, the contact ends of the short circuiting switch (S4) connecting the two bent legs (50d, 52d) which are formed by the inner contact strips (50, 52) with one another as fixed contacts during the releasing position of the inner trigger part (33).

15. The apparatus of claim 13, further comprising an outer plug-in rong (11b); a first inner contact strip (50), which is connected over the outer plug-in prong (11b) to form a connection (51) with an adjacent contact leg (47a) of a further connector (47) on the circuit board (22a), the first inner contact strip (50) further extending on upwards to make connection of the negative pole with the right/left switch region (26) and the short circuiting switch (S4); a further contact leg (46a) forming a second connection (53) with the second contact strip (52), which leads upwards parallel to the first in an appropriate, complementary construction, the further contact leg (46a), which starts out from the circuit board (22a) and forms, with an increase in width,a second fixed contact for one of the switches (S2) to bridge when in a full-load operation.

16. The apparatus of claim 14, wherein the circuit board has resistance tracks mounted thereon, the inner trigger part (33) accommodating in a lateral guide a bifurcated wiper (28) which has legs that glide under tension directly on the resistance tracks.

17. The apparatus of claim 13, further comprising a rocker arm (20) with rocker contacts, and angular contact strips (59a, 59b) which extend to the outside to the plu-in prongs (12a, 12b) for connection with the motor, the right/left switch region (26), which is disposed in the upper compartment of the housing (21), comprising an internal partial wall structure (57), which, by means of recesses, projections, and catches support the bilateral contact lugs (50c, 52c) of the inner contact strips (50, 52 ), as well as, adjacent to the rocker contacts, the rocker contacts being pressed by the rocker arm (20) into opposite contact positions with the angular contact strips (59a, 59b).

18. The apparatus of claim 17, wherein the housing has window-like openings (66), the internal partial wall structure (57) for the right/left switching being seated with respective projections (57a, 57b) in the window-like openings (66) of the housing (21) where the plug-in prongs (12a, 12b), which start out from the right/left switching, pass through the housing.

19. The apparatus of claim 18, wherein the tension spring (40) has a rear pivotal point and exerts a pressure on the inner trigger part (33) which is absorbed on both sides of the inner trigger part and is kept away from the walls of the housing when the trigger handle (14) is released because at least one of the inner contact strips (50, 52) touches the rear pivotal point of the spring and lies with front fixed contacts for the short circuiting switch (S4) against the projections of the inner trigger part (33), the inner trigger part (33) becoming free in response to withdrawal of the contact bridge (53).

20. The apparatus of claim 1, wherein only four plug-in prong connections (11a, 11b, 12a, 12b), which protrude through the housing to the outside, are provided on the housing for effecting bipolar connection with the battery and with the driving motor.

21. The apparatus of claim 17, further comprising a switch lever (16) for the right/left switching, which is disposed above the trigger handle (14); further comprising means for preventing the switch lever from displacing when the trigger handle is depressed and for engaging the rocker arm (20) of the right-left switch over a hole/pin sliding connection.

22. The apparatus of claim 1, wherein the housing (21) comprises a box-shaped basic part, which defines the depth of the housing and in which individual circuit components of the electrical circuit means are inserted consecutively and of a cover (21b), which covers one side of the base part.

* * * * *